(12) United States Patent
Wang et al.

(10) Patent No.: US 10,811,333 B2
(45) Date of Patent: Oct. 20, 2020

(54) IGBT MODULE ASSEMBLY

(71) Applicant: Gree Electric Appliances, Inc. of Zhuhai, Guangdong (CN)

(72) Inventors: Jing Wang, Guangdong (CN); Shiyong Jiang, Guangdong (CN); Yu Zhang, Guangdong (CN); Keqin Liu, Guangdong (CN)

(73) Assignee: Gree Electric Appliances, Inc. of Zhuhai, Guangdong (CN)

( * ) Notice: Subject to any disclaimer, the term of this patent is extended or adjusted under 35 U.S.C. 154(b) by 58 days.

(21) Appl. No.: 16/095,651

(22) PCT Filed: Apr. 1, 2017

(86) PCT No.: PCT/CN2017/079246
§ 371 (c)(1),
(2) Date: Oct. 22, 2018

(87) PCT Pub. No.: WO2017/181840
PCT Pub. Date: Oct. 26, 2017

(65) Prior Publication Data
US 2019/0131205 A1 May 2, 2019

(30) Foreign Application Priority Data

Apr. 22, 2016 (CN) .......................... 2016 1 0254996

(51) Int. Cl.
*H01L 23/367* (2006.01)
*H01L 23/00* (2006.01)
(52) U.S. Cl.
CPC ........ *H01L 23/3675* (2013.01); *H01L 23/367* (2013.01); *H01L 23/3672* (2013.01);
(Continued)

(58) Field of Classification Search
None
See application file for complete search history.

(56) References Cited

U.S. PATENT DOCUMENTS

| | | | |
|---|---|---|---|
| 6,408,937 B1 * | 6/2002 | Roy | H01L 23/427 165/104.22 |
| 2011/0316143 A1 * | 12/2011 | Noritake | H01L 23/34 257/713 |

(Continued)

FOREIGN PATENT DOCUMENTS

| | | |
|---|---|---|
| CN | 201623026 U | 11/2010 |
| CN | 202282938 U | 6/2012 |

(Continued)

OTHER PUBLICATIONS

International Search Report corresponding to International Patent Application No. PCT/CN2017/079246, dated Jun. 3, 2017.

(Continued)

*Primary Examiner* — Steven M Christopher
(74) *Attorney, Agent, or Firm* — McAndrews, Held & Malloy, Ltd.

(57) ABSTRACT

The disclosure relates to the field of electronic elements, and discloses an Insulated Gate Bipolar Transistor (IGBT) module assembly which comprises a cooling plate and an IGBT module fixedly connected to the cooling plate, wiring terminals are arranged at an end face of the IGBT module, which is away from the cooling plate, the IGBT module comprises a side face adjacent to the end face, and the side face and the cooling plate form a water guiding groove. In the disclosure, the side face and the cooling plate form the water guiding groove, and a great amount of condensed water collected on the cooling plate can be guided to flow out through the water guiding groove instead of flowing to the end face of the IGBT module, on which the wiring terminals are arranged.

10 Claims, 4 Drawing Sheets

(52) U.S. Cl.
CPC .......... *H01L 24/42* (2013.01); *H01L 2224/42* (2013.01); *H01L 2924/13055* (2013.01)

(56) References Cited

U.S. PATENT DOCUMENTS

| | | | |
|---|---|---|---|
| 2013/0328185 A1* | 12/2013 | Hiramitsu | ............... H01L 21/52 257/719 |
| 2014/0022727 A1 | 1/2014 | Bertotto | |
| 2014/0284783 A1 | 9/2014 | Sayama | |
| 2015/0009626 A1 | 1/2015 | Lan et al. | |
| 2015/0021750 A1 | 1/2015 | Fujino et al. | |
| 2016/0035658 A1 | 2/2016 | Kessler et al. | |
| 2017/0263531 A1* | 9/2017 | Fukuoka | ............. H01L 29/1602 |

FOREIGN PATENT DOCUMENTS

| | | |
|---|---|---|
| CN | 104729057 A | 6/2015 |
| CN | 204497219 U | 7/2015 |
| CN | 105390460 A | 3/2016 |
| CN | 105789156 A | 7/2016 |
| CN | 205723509 U | 11/2016 |

OTHER PUBLICATIONS

The extended European search report for application No. EP17785325.6, dated Sep. 11, 2019.

Search report for Chinese application No. CN2016102549968, filed Apr. 22, 2016.

\* cited by examiner

IGBT MODULE ASSEMBLY

RELATED APPLICATIONS

This application is a 371 of International Patent Application No. PCT/CN2017/079246, filed Apr. 1, 2017, entitled "IGBT Module Assembly," which claims priority to Chinese Patent Application No. 201610254996.8, filed Apr. 22, 2016, both of which are incorporated herein by reference in their entirety.

TECHNICAL FIELD

The disclosure relates to an electronic element, in particular to an Insulated Gate Bipolar Transistor (IGBT) module assembly.

BACKGROUND

An IGBT module is a modularized semiconductor comprising an IGBT and an Fly-Wheel Diode (FWD) which are bridged and encapsulated through a particular circuit, and the heat dissipation efficiency of the IGBT module is a key factor that restricts the performance and the reliability. At present, a cooling problem of the IGBT module is solved through two heat-dissipating methods, namely an air cooling method and a liquid cooling method, wherein the air cooling method is that a fan is used for blowing or pumping so as to cool the IGBT module, and has the advantages of simple structure, low cost, good safety and reliability and the disadvantages of big noise and low dissipation efficiency, and is difficult to apply to a high-power condition with a serious heat dissipation problem.

The liquid cooling method is that refrigerant liquid with relatively high unit heat capacity is used as circulating cooling medium of a cooling plate, then an IGBT module 10 is mounted on the cooling plate 20 and transfers heat to a cooling plate 20; refrigerant pipes 30 are arranged in the cooling plate 20, and refrigerant liquid in the refrigerant pipes 30 is used for heat exchanging, so that the IGBT module can be cooled. As shown in FIG. 1, the method has the advantages of high efficiency and low noise and is very suitable for a high-power condition with a serious heat dissipation problem of the IGBT module. However, in the process of liquid cooling, a great amount of condensed water may be formed and be collected on the cooling plate 20, and the higher the working power, the more the condensed water. With the collection of the condensed water and the vibration of the units, the condensed water may form unordered flow on the surface of the cooling plate 20 and that of the IGBT module 10, thus probably cause a interelectrode short circuit between wiring terminals of the IGBT module 10, resulting in an electrical safety accident.

SUMMARY

The disclosure aims to provide an IGBT module assembly so as to solve the problem of a liquid cooling method in the related art that interelectrode short circuit of wiring terminals of an IGBT module is caused by condensed water, thus resulting an electrical safety accident.

Aiming to solve the problem, the disclosure adopts the following technical scheme:

An IGBT module assembly, which includes a cooling plate and an IGBT module fixedly connected on the cooling plate, a wiring terminal being arranged an end face, which is away from the cooling plate, of the IGBT module, the IGBT module including a side face adjacent to the end face, and a water guiding groove formed on the side face and the cooling plate.

According to an example embodiment, one end of the side face, which is close to the cooling plate, is inclined to a center of the IGBT module.

According to an example embodiment, one end of the side face, which is close to the cooling plate, is inclined at an angle of 30 degrees to 60 degrees to the center of the IGBT module.

According to an example embodiment, one end of the side face, which is close to the cooling plate, is inclined at an angle 45 degrees to the center of the IGBT module.

According to an example embodiment, a semicircular open groove is formed in one end of the side face, which is close to the cooling plate, and a water guiding groove is formed by the open groove and the surface of the cooling plate.

According to an example embodiment, the IGBT module adopts a polyhedral frustum structure or a cone frustum structure.

According to an example embodiment, the IGBT module adopts a tetrahedral frustum structure, and the side face is in the shape of an isosceles trapezoid.

According to an example embodiment, a plurality of refrigerant pipes are arranged in the cooling plate in a coiled manner, and refrigerant medium flows in the refrigerant pipes.

According to an example embodiment, the cooling plate is a metal plate, and connecting holes allowing the refrigerant pipes to be arranged in a coiled manner are formed in the cooling plate in a run-through manner.

According to an example embodiment, a plurality of mounting holes are formed in the IGBT module, and threaded holes are formed in the cooling plate at the positions corresponding to the mounting holes and arranged in a manner of keeping away from the connecting holes.

The disclosure has the following benefits: through the water guiding groove formed by the side face and the cooling plate, particularly through the water guiding groove formed in a manner that one end of the side face of the IGBT, which is close to the cooling plate, is inclined to the center of the IGBT module, so as a great amount of condensed water collected on the cooling plate can be guided and diverted out instead of flowing to the end faces of the IGBT module, on which the wiring terminals are arranged, so that the situation of interelectrode short circuit of the wiring terminals on the IGBT module can be avoided, and electrical safety accidents can be prevented. In addition, the IGBT module can work safely and efficiently in a high-power condition with a heat dissipation problem, so that the application filed of the IGBT module is expanded.

1, cooling plate; 2, IGBT module; 3, wiring terminal; 4, water guiding groove; 5, open groove; 11, refrigerant pipe; 21, end face; 22, side face; 23, mounting hole; 10, IGBT module; 20, cooling plate; 30, refrigerant pipe.

DETAILED DESCRIPTION OF THE EMBODIMENTS

The technical scheme of the disclosure is further described through the following embodiments in combination with the figures.

EMBODIMENT 1

Figure 1:
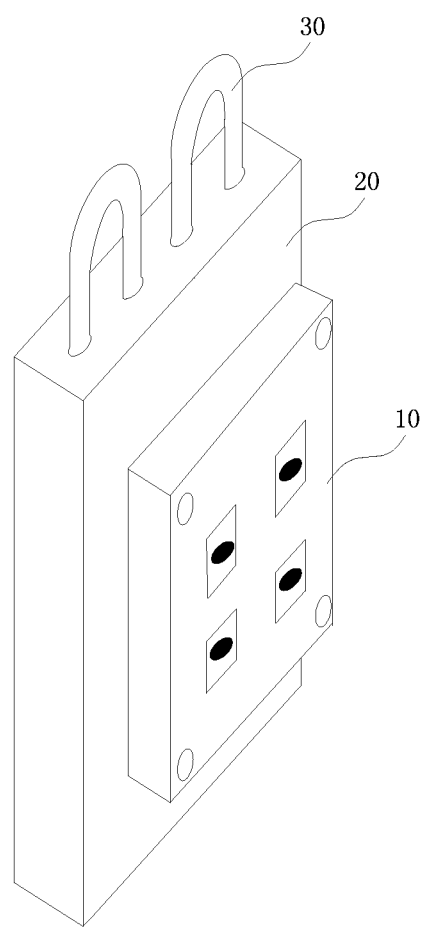
FIG. 1 is an assembled structure diagram of an IGBT module and a cooling plate in the related art.
Figure 2:
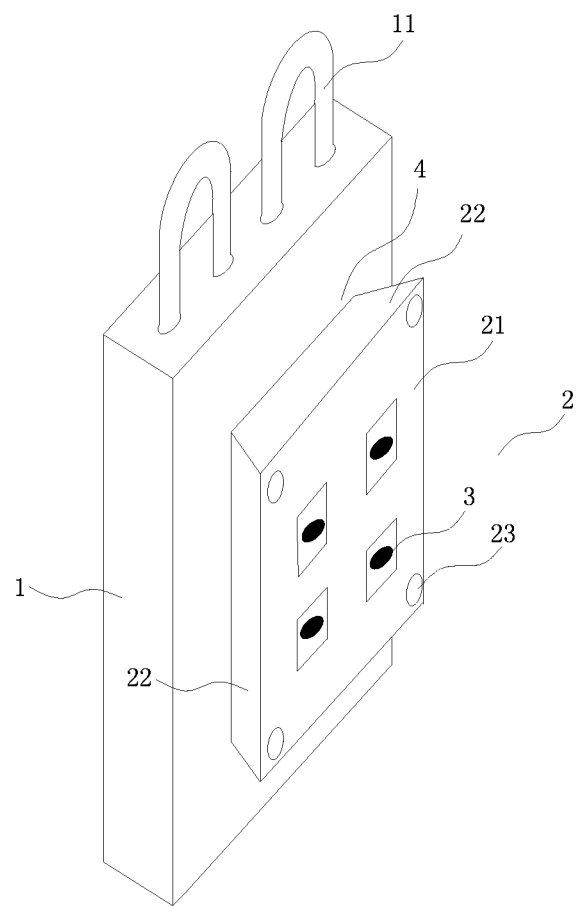
FIG. 2 is a three-dimensional diagram of an assembled structure of an IGBT module and a cooling plate in embodiment 1 of the disclosure.
Figure 3:
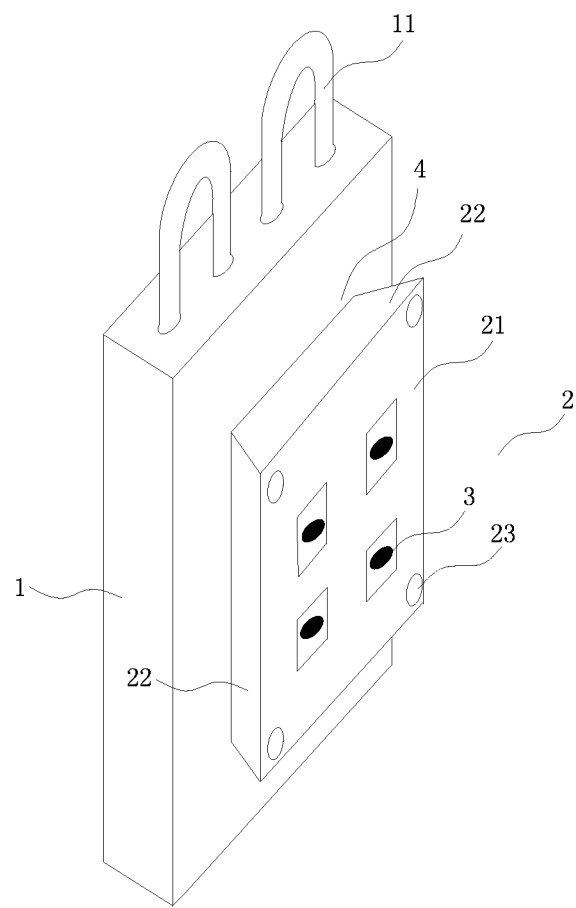
FIG. 3 is a side view of the assembled structure of the IGBT module and the cooling plate in embodiment 1 of the disclosure.

The disclosure provides an IGBT module assembly as shown in FIG. 2 and FIG. 3. The IGBT module assembly includes a cooling plate 1 and an IGBT module 2 fixedly connected to the cooling plate 1, wherein the cooling plate 1 adopts a cuboid structure, a plurality of refrigerant pipes 11 are arranged in the cooling plate in a coiled manner, and refrigerant medium flows in the refrigerant pipes 11 and used for cooling the IGBT module 2. In an example embodiment, connecting holes (not shown in the figure) which run through the cooling plate 1 are formed inside the cooling plate 1 and used for allowing the refrigerant pipes 11 to be arranged in a coiled manner. A plurality of threaded holes (not shown in the figure) are formed in a surface of the cooling plate 1, which is in contact with the IGBT module 2, and keep away from the connecting holes. In the embodiment, according to an example manner, the cooling plate 1 is made of metal so as to have better thermal conductivity, and heat radiated by the IGBT module 2 is able to be transferred to the cooling plate 1, which is able to be cooled by the refrigerant medium in the refrigerant pipes 11, so that the cooling effect can be further improved.

The IGBT module 2 includes end faces 21, which are away from the cooling plate 1, and a side face 22 adjacent to the end faces 21, wherein a plurality of wiring terminals 3 are arranged on the end faces 21 and may form electrical connection with the outside through screws. The side face 22 and the cooling plate 1 form a water guiding groove 4 together. When the cooling plate 1 starts to cool the IGBT module 2, a great amount of condensed water may be collected, and the condensed water is able to be guided by the water guiding groove 4 to flow out from the water guiding groove 4 instead of flowing to the surface of the IGBT module 2, on which the wiring terminals 3 are arranged, so that the situation of interelectrode short circuit of the wiring terminals 3 can be avoided, and electrical safety accidents can be prevented.

In the embodiment, one end of the side face 22, which is close to the cooling plate 1, is inclined to the center of the IGBT module 2, and the side face 22 arranged in an inclined manner and the cooling plate form the water guiding groove 4 together, so that the condensed water can be guided to flow out.

In an example embodiment, one end of the side face 22, which is close to the cooling plate 1, is inclined to the center of the IGBT module 2 at an angle of 30 degrees to 60 degrees, due to the arrangement of the angle, the water guiding groove 4 has a better water guiding effect, and the comprehensive benefits are higher in terms of manufacturing techniques and material conservation. More preferably, the angle of inclination is set to be 45 degrees.

The IGBT module 2 may adopt a polyhedral frustum structure or a cone frustum structure, as long as one end of the side face 22, which is close to the cooling plate 1, is inclined to the center of the IGBT module 2. In the embodiment, the IGBT module 2 adopts a tetrahedral frustum structure, correspondingly, the side face 22 is of a trapezoidal structure, and one side of the side face 22, which is contact with the cooling plate 1, is the upper bottom edge, namely, the shorter side. Therefore, the structure of the water guiding groove can be formed. In an example embodiment, the side face 22 may be of an isosceles-trapezoid-like structure.

A plurality of mounting holes 23 in one-one correspondence with threaded holes of the cooling plate 1 are formed in the IGBT module 2. The IGBT module 2 can be fixed on the cooling plate 1 through bolts that passing through the mounting holes 23 and in threaded connection with the threaded holes. In the embodiment, the threaded holes of the cooling plate 1 are arranged in a manner of keeping away from the connecting holes, so that the problem that when the cooling plate 1 and the IGBT module 2 are assembled, refrigerant pipes 11 in the cooling plate 1 interferes with the assembling may be avoided, and the refrigerant pipes 11 are prevented from compressional deformation or damage.

In the embodiment, through the structure of the IGBT module assembly, no manner how the IGBT module is placed, the condensed water may not flow to the surface of the IGBT module 2, on which the wiring terminals 3 are arranged. For example, when the IGBT module assembly is placed vertically, the condensed water is collected between the cooling plate 1 and the side face 22 of the top of the IGBT module 2, and the side face 22 is inclined to play a role of stopping, so that the condensed water may be guided to both sides of the cooling plate 1 and the IGBT module 2 and flows down along the water guiding groove 4 formed by the cooling plate 1 and the two sides of the IGBT module 2. The water flow may not form on the end face 21 of the IGBT module 2, on which the wiring terminals 3 are arranged, thus interelectrode short circuit of the wiring terminals 3 can be avoided. When the IGBT module assembly is placed horizontally (the cooling plate 1 is on the upper side and the IGBT module 2 is on the lower side), as the side face 22 of the IGBT module 2 is in the form of a umbrella-shaped structure, the condensed water may flow down from the four sides 22 of the IGBT module 2, so that the wiring terminals 3 are protected from contacting the condensed water. When the IGBT module assembly is placed horizontally (the IGBT module 2 is on the upper side and the cooling plate 1 is on the lower side), the condensed water is collected at an area close to where the surface of the cooling plate 1 is in contact with the IGBT module 2, and under the influence of gravity, the condensed water may not flow to the end faces 21 of the IGBT module 2, and the wiring terminals 3 may not be in contact with the condensed water.

Through the structure of the IGBT module assembly, the IGBT module can work safely and efficiently under a high-power condition with a dissipation problem, so that the application field of the IGBT module is expanded.

EMBODIMENT 2

Figure 4:
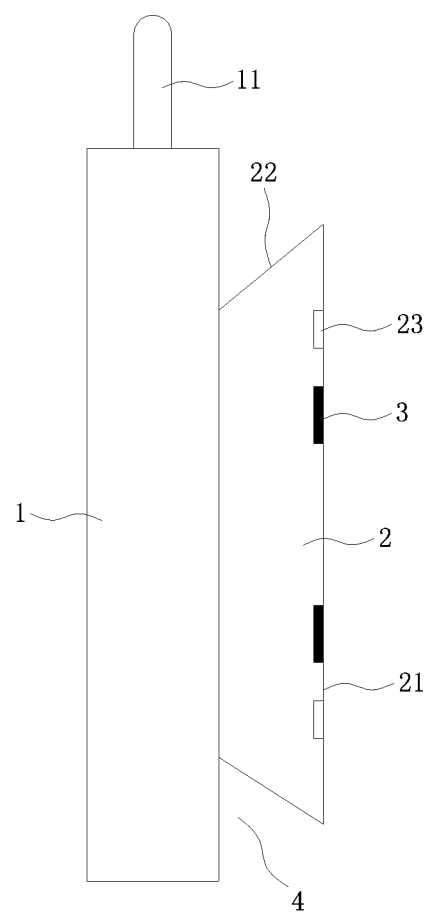
FIG. 4 is a three-dimensional diagram of the assembled structure of the IGBT module and the cooling plate in embodiment 2 of the disclosure.

In the embodiment, the structure of the water guiding groove 4 is further improved based on the embodiment 1, particularly, as shown in FIG. 4, in the embodiment, a semicircular open groove 5 is formed in one end, close to the cooling plate 1, of the side face 22 of the IGBT module 2. The open groove 5 and the cooling plate 1 form the water guiding groove 4 together, and the condensed water may directly flow out of the IGBT module 2 through the water guiding groove 4 during collection. Through the arrangement of the open groove 5, when the IGBT module 2 is placed vertically, the condensed water can flow in the water guiding groove 4 formed by the open groove 5 and the cooling plate 1 along the surface of the cooling plate 1 and the side face 22 and may not flow to the end face 21 of the IGBT module 2 on which the wiring terminals 3 are arranged.

The other structures are the same to those of the embodiment 1 and are not detailed here any more.

It is parent that the embodiments of the disclosure are only used for clearly explain the examples illustrated in the disclosure instead of restricting the embodiments of the disclosure. For those skilled in the art, different changes or variations may be made based on the above description. Not all the embodiments are necessarily enumerated here. Any modification, equivalent replacement, improvement and the like based on the spirit and principle of the disclosure shall fall in the protective scope of the claims of the disclosure.

What is claimed is:

1. An Insulated Gate Bipolar Transistor (IGBT) module assembly, comprising a cooling plate (1) and an IGBT module (2) fixed connected to the cooling plate (1); a wiring terminal (3) being arranged on an end face (21) of the IGBT module (2), which is away from the cooling plate (1); the IGBT module (2) comprising a side face (22) adjacent to the end face (21), and a water guiding groove (4) formed on the side face (22) and the cooling plate (1).

2. The IGBT module assembly as claimed in claim 1, wherein one end of the side face (22), which is close to the cooling plate (1), is inclined to a center of the IGBT module (2).

3. The IGBT module assembly as claimed in claim 2, wherein one end of the side face (22), which is close to the cooling plate (1), is inclined to the center of the IGBT module (2) at an angle of 30 degrees to 60 degrees, which is measured relative to a plane perpendicular to the end face (21) or a plane parallel to the end face (21).

4. The IGBT module assembly as claimed in claim 3, wherein one end of the side face (22), which is close to the cooling plate (1), is inclined to the center of the IGBT module (2) at an angle of 45 degrees, which is measured relative to the plane perpendicular to the end face (21) or the plane parallel to the end face (21).

5. The IGBT module assembly as claimed in claim 1, wherein a semicircular open groove (5) is formed in one end, close to the cooling plate (1), of the side face (22), and the open groove (5) and a surface of the cooling plate (1) form the water guiding groove (4).

6. The IGBT module assembly as claimed in claim 1, wherein the IGBT module (2) adopts a polyhedral frustum structure or a cone frustum structure.

7. The IGBT module assembly as claimed in claim 6, wherein the IGBT module (2) adopts a tetrahedral frustum structure, and the side face (21) is in a shape of a isosceles trapezoid.

8. The IGBT module assembly as claimed in claim 1, wherein a plurality of refrigerant pipes (11) are arranged in the cooling plate (1) in a coiled manner, and refrigerant medium flows in the refrigerant pipes (11).

9. The IGBT module assembly as claimed in claim 8, wherein the cooling plate (1) is a metal plate, connecting holes allowing the refrigerant pipes (11) to be arranged in a coiled manner are formed in the cooling plate (1) in a run-through manner.

10. The IGBT module assembly as claimed in claim 9, wherein a plurality of mounting holes (23) are formed in the IGBT module (2), and threaded holes are formed in the cooling plate (1) at the positions corresponding to the mounting holes (23) and are arranged in a manner of keeping away from the connecting holes.

* * * * *